US006693311B2

United States Patent
Guenter et al.

(10) Patent No.: US 6,693,311 B2
(45) Date of Patent: Feb. 17, 2004

(54) WAVELENGTH SELECTIVE DETECTOR

(75) Inventors: James K. Guenter, Garland, TX (US); Ralph H. Johnson, Murphy, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/162,928

(22) Filed: Jun. 4, 2002

(65) Prior Publication Data
US 2003/0222275 A1 Dec. 4, 2003

(51) Int. Cl.[7] .......................................... H01L 31/0328
(52) U.S. Cl. ........................ 257/184; 257/186; 257/229; 257/233; 257/290; 257/431; 250/44.1; 250/227.23; 250/226
(58) Field of Search ................................. 257/184, 186, 257/225, 229, 233, 290, 431; 250/214.1, 227.23, 226

(56) References Cited
U.S. PATENT DOCUMENTS

| | | | |
|---|---|---|---|
| 4,857,727 A | | 8/1989 | Lenz et al. |
| 5,557,117 A | * | 9/1996 | Matsuoka et al. .......... 257/184 |
| 5,650,635 A | * | 7/1997 | Razeghi et al. ............... 257/21 |
| 5,770,868 A | * | 6/1998 | Gill et al. .................... 257/190 |

* cited by examiner

Primary Examiner—Wael Fahmy
Assistant Examiner—Wai-Sing Louie
(74) Attorney, Agent, or Firm—Andrew A. Abeyta

(57) ABSTRACT

A wavelength selective detector having a first absorbing layer for absorbing light with a wavelength below a lower band cutoff, a second absorbing layer downstream of the first absorbing layer for absorbing light with a wavelength below an upper band cutoff, and a confinement layer situated between the first and second absorbing layers. The lower and upper band cutoffs can be set by controlling the bandgaps and/or thicknesses of the first and second absorbing layers. The wavelength selective detector of the present invention has a good out-of-band rejection, a narrow spectral responsivity, and a high in-band responsivity. In addition, the wavelength selective detector is relatively easy to manufacture using conventional integrated circuit fabrication techniques.

21 Claims, 5 Drawing Sheets

WAVELENGTH SELECTIVE DETECTOR

BACKGROUND OF THE INVENTION

This invention relates to the field of optoelectronic devices, and more particularly, to wavelength selective optoelectronic detectors.

Optoelectronic devices have found widespread use in telecommunications, medical, manufacturing and many other fields. Semiconductor lasers, semiconductor photo diodes, semiconductor photo detectors, etc., are all used in a wide variety of applications. In many applications, it is desirable for a detector to only detect selected optical signals. For example, in an application where the detector is exposed to a noisy optical environment, it may be desirable for the detector to only detect a narrow spectrum of light produced by a selected optical source like an LED or laser. That is, it can be desirable for a detector to be able to select an intended optical signal from the various optical signals present in the environment. Such a wavelength selective detector may help minimize the interference caused by unintended radiation sources.

In some applications, such as Wavelength Division Multiplexing (WDM) applications, it is desirable for the detector to be able to select a single wavelength from a number of signals that have closely spaced wavelengths. Such a wavelength selective detector may help increase the effective bandwidth of some fiber optic data channels.

Existing techniques for making wavelength-selective detectors include resonantcavity detectors, as well as assemblies that include, for example, one or more bandpass filters coupled together with a broad-band detector. However, these techniques often have significant drawbacks including, for example, high manufacturing costs and/or significant performance limitations.

SUMMARY OF THE INVENTION

The present invention provides a wavelength selective detector for detecting a desired wavelength or range of wavelengths of light. The wavelength selective detector of the present invention provides good out-of-band rejection, narrow spectral responsivity, and high in-band responsivity. In addition, the wavelength selective detector of the present invention is relatively easy to manufacture using conventional integrated circuit and compound semiconductor epitaxy fabrication techniques.

In one illustrative embodiment of the present invention, the wavelength selective detector includes a first absorbing layer for absorbing light that has a wavelength below the desired wavelength or range of wavelengths. Thus, the first absorbing layer may establish the lower cutoff of the wavelength selective detector. Tailoring the first absorbing layer to absorb wavelengths that are below the desired wavelength or range of wavelengths may be accomplished in any number of ways, including for example, using a material or material system that has an appropriate bandgap as well as adjusting the thickness of the first absorbing layer. The first absorbing layer may generate one or more carriers when absorbing light.

A second absorbing layer may be provided downstream of the first absorbing layer. The second absorbing layer preferably absorbs light that has the desired wavelength or range of wavelengths. Thus, the second absorbing layer may establish the upper cutoff of the wavelength selective detector. Again, this may be accomplished in any number of ways, including for example, using a material or material system that has an appropriate bandgap as well as adjusting the thickness of the second absorbing layer. Like the first absorbing layer, the second absorbing layer may also generate one or more carriers when the second absorbing layer absorbs light. A PN junction is preferably provided in or adjacent to the second absorbing layer for separating the carriers that are generated in the second absorbing layer, and to provide the output current for the detector.

To help prevent the carriers that are generated in the first absorbing layer from entering and affecting the output current of the detector (i.e. in the second absorbing layer), a confinement layer may be provided between the first absorbing layer and the second absorbing layer. To accomplish this, the confinement layer may, for example, have a higher bandgap than the first absorbing layer. The confinement layer preferably is at least substantially transparent to the desired wavelength or range of wavelengths of interest. To accomplish this, the confinement layer may, for example, have a higher bandgap than the second absorbing layer.

In some embodiments, the above detector is formed on a substrate. Light having a wavelength that is longer than the desired wavelength or range of wavelengths may pass through the first absorbing layer, the confinement layer, and the second absorbing layer before it is absorbed by the substrate. Some of the light may pass through the substrate altogether. In any event, to help prevent carriers that are generated in the substrate from entering and affecting the output current of the detector (e.g. in the second absorbing layer), a second confinement layer may be provided between the second absorbing layer and the substrate. The second confinement layer preferably is at least substantially transparent to wavelengths that are longer than the desired wavelength or range of wavelengths.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
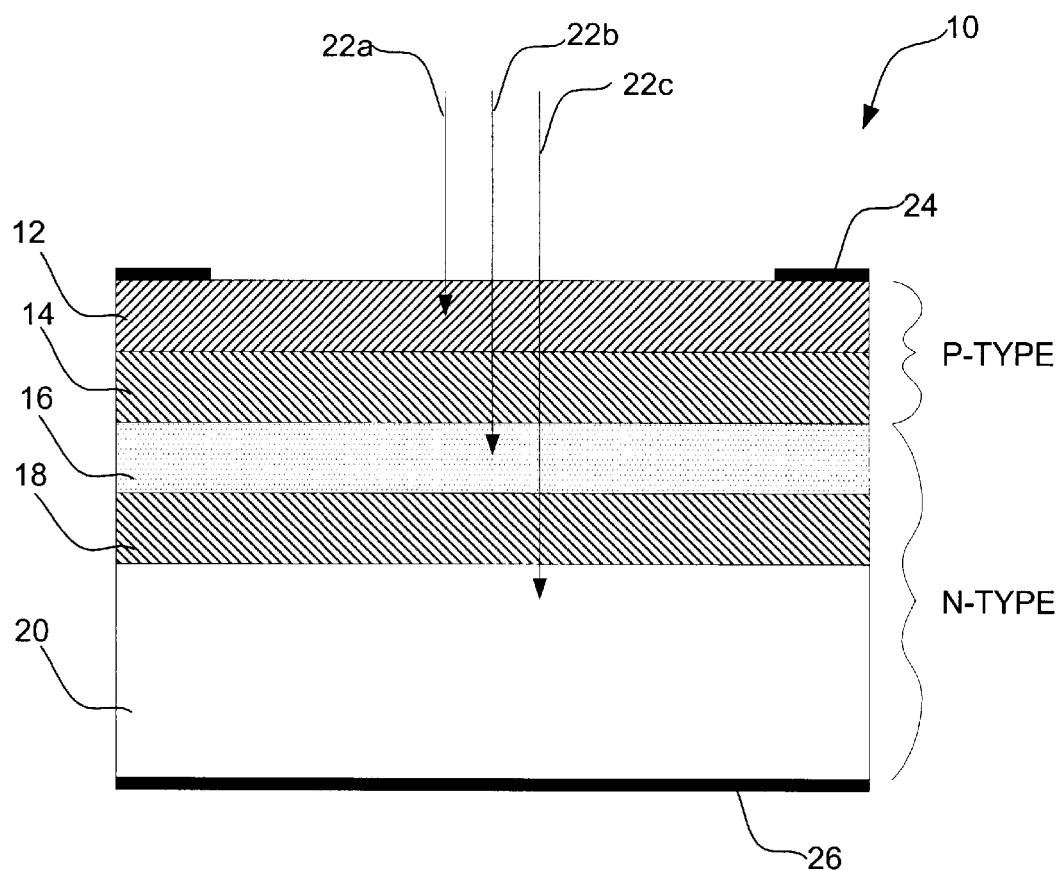
FIG. 1 is a schematic cross-sectional view of an illustrative wavelength selective detector in accordance with the present invention.

FIG. 1 is a schematic cross-sectional view of an illustrative wavelength selective detector in accordance with the present invention. The illustrative wavelength selective detector is generally shown at 10, and includes a first absorbing layer 12, an upper confinement layer 14, a second absorbing layer 16, a lower confinement layer 18, and a substrate 20. In the embodiment shown, the light enters the detector 10 from the top, as shown at 22a–22c. The detector 10 preferably is only responsive to light that has a desired wavelength or range of wavelengths.

The first absorbing layer 12 preferably absorbs light 22a with a wavelength that is below the desired wavelength or range of wavelengths. The first absorbing layer may be tailored to absorb wavelengths that are below the desired wavelength or range of wavelengths in any suitable manner, including for example, using a material or material system that has an appropriate bandgap as well as by adjusting the thickness of the first absorbing layer. The first absorbing layer may generate one or more carriers when absorbing light 22a.

The second absorbing layer 16 is positioned downstream of the first absorbing layer 12, as shown. The second absorbing layer 16 preferably absorbs light 22b that has the desired wavelength or range of wavelengths, and passes light 22c that has a wavelength that is longer than the desired wavelength or range of wavelengths. Again, this may be accomplished in any suitable manner, including for example, using a material or material system that has an appropriate bandgap as well as by adjusting the thickness of the second absorbing layer 16. Like the first absorbing layer 12, the second absorbing layer 16 may also generate one or more carriers when the first absorbing layer 16 absorbs light 22b.

To help prevent carriers that are generated in the first absorbing layer 12 from entering the second absorbing layer 16 (and thus affecting the output current of the detector 10), an upper confinement layer 14 may be provided between the first absorbing layer 12 and the second absorbing layer 16. The upper confinement layer 14 preferably has a higher bandgap than the first absorbing layer 12 and the second absorbing layer 16.

A PN junction is preferably formed to separate the carriers generated in the second absorbing layer 16. In the illustrative embodiment shown in FIG. 1, the PN junction is formed between the second absorbing layer 16 and the upper confinement layer 14. However, a PN junction may be formed between the second absorbing layer 16 and the lower confinement layer 18, or within the second absorbing layer, depending the application. The PN junction preferably separates the carriers generated in the second absorbing layer to help produce an output current.

Light having a wavelength that is longer than the desired wavelength or range of wavelengths preferably passes through the first absorbing layer 12, the upper confinement layer 14, and the second absorbing layer 16, before it is absorbed or passes through the substrate 20. To help prevent carriers that are generated in the substrate from entering the second absorbing layer 16 (and affecting the output current of the detector 10), the lower confinement layer 18 may be provided between the second absorbing layer 16 and the substrate 20. The lower confinement layer 18 may, for example, have a higher bandgap than the substrate 20, which may help prevent carriers that are generated in the substrate from entering the second absorbing layer 16. The lower confinement layer 18 preferably also is at least substantially transparent to wavelengths that are longer than the desired wavelength or range of wavelengths. Thus, the lower confinement layer 18 may, for example, have a bandgap that is high enough to pass this light. In some embodiments, a buffer layer (not shown) or the like may be provided between the substrate 20 and the lower confinement layer 18 to help with any lattice mismatch, if any, between the substrate 20 and the rest of the structure.

To provide an electrical connection to the PN junction of the detector 10, an upper contact layer 24 and a lower contact layer 26 may be provided. In the illustrative embodiment of FIG. 1, the upper contact layer 24 is provided above the first absorbing layer 12, and forms an electrical connection to the first absorbing layer 12. The lower contact layer 26 is provided on the lower surface of the substrate 20, and forms an electrical connection to the substrate 20. In some embodiments, one or more buffer layers (not shown) may be provided between the upper contact layer 24 and the first absorbing layer 12, and/or between the lower contact layer 26 and the substrate 20, if desired.

As indicated above, the PN junction of FIG. 1 is formed between the second absorbing layer 16 and the upper confinement layer 14. Thus, the first absorbing layer 12 and the upper confinement layer 14 are preferably doped to be a first conductivity type, and the second absorbing layer 16, the lower confinement layer 18 and the substrate 20 are doped to be of the opposite conductivity type. In a preferred embodiment, the first absorbing layer 12 and upper confinement layer 14 are doped p-type, and the second absorbing layer 16, the lower confinement layer 18 and the substrate are doped n-type.

During operation, and when an incident light is provided to the detector 10, the first absorbing layer 12 absorbs light 22a having a wavelength that is below the desired wavelength or range of wavelengths. The light 22b and 22c that has the desired wavelength or range of wavelengths, or has a longer wavelength, preferably passes through the first absorbing layer 12 and the upper confinement layer 14. The second absorbing layer 16 then preferably absorbs light 22b having a wavelength with the desired wavelength or range of wavelengths, and passes light 22c that has a longer wavelength. The light 22c that has a longer wavelength preferably passes through the lower confinement layer 18 and into the substrate. Some of the light 22c that passes into the substrate may be absorbed by the substrate.

RED WAVELENGTH SELECTIVE DETECTOR EXAMPLE

An illustrative wavelength selective detector 10 that is responsive to the red wavelengths is now described. In this illustrative example, the first absorbing layer 12 is about 2um of $Al_{0.335}Ga_{0.665}As$, which produces a cutoff wavelength of about 663 nm. The Al fraction is used to tune the bandgap of the first absorbing layer 12. When so provided, only wavelengths that are longer than about 663 nm tend to pass through the first absorbing layer 12 and into the remainder of the structure. The first absorbing layer 12 may be doped p-type at a concentration of about 1E18.

The remaining light 22b and 22c then passes into the upper confinement layer 14. The upper confinement layer 14 may be about 0.2 um of $Al_{0.6}Ga_{0.4}As$, which produces a cutoff wavelength of about 564 nm. Thus, the upper confinement layer 14 may be substantially transparent to the light 22b and 22c that passes through the first absorbing layer 12. However, the bandgap of the upper confinement layer 14 may be higher than the bandgap of the first absorbing layer 12, which may help prevent the carriers that are generated in the first absorbing layer 12 from reaching the second absorbing layer 16. The upper confinement layer 14 may be doped p-type at a concentration of about 1E18.

The second absorbing layer 16 receives the light 22b and 22c that passes through the first absorbing layer 12 and the upper confinement layer 14. The second absorbing layer may be about 2.5 um of $Al_{0.28}Ga_{0.72}As$, which produces a cutoff wavelength of about 689 nm. Thus, the second absorbing layer 16 may absorb the remaining light that has a wavelength between 663 and 689 nm, and may pass the light 22c that has a wavelength that is longer than about 689 nm. The second absorbing layer 16 may be doped n-type at a fairly low concentration, such as about <5E14. This fairly low concentration may help the second absorbing layer 16 become more easily depleted under the reverse bias operating conditions, which may help increase the speed of the detector 10.

The lower confinement layer 18 receives the light 22c that passes through the second absorbing layer 16. The lower confinement layer 18 may be about 0.1 um of $Al_{0.6}Ga_{0.4}As$, which produces a cutoff wavelength of about 564 nm. Thus, the lower confinement layer 16 may be substantially transparent to the light 22c that passes through the second absorbing layer 16. In the illustrative example, the lower confinement layer 18 may be doped n-type at a concentration of about 3E18.

In some embodiments, a buffer layer may be provided between the lower confinement layer 18 and the substrate 20. The buffer may be, for example, about 0.2 um of $Al_{0.0}Ga_{1.0}As$, which produces a cutoff wavelength of about 871 nm. The buffer layer may be doped n-type at a concentration of about 1E18.

Finally, the substrate 20 may be GaAs, which is doped n-type. Some of the light 22c that passes through the lower confinement layer 18 is absorbed by the substrate 20. To help prevent carriers that are generated in the substrate 20 from reaching the second absorbing layer 16, the bandgap of the lower confinement layer 18 is preferably higher than the bandgap of the substrate 20.

INFRARED WAVELENGTH SELECTIVE DETECTOR EXAMPLE

An illustrative wavelength selective detector 10 that is responsive to the infrared wavelengths is now described. In this illustrative embodiment, the first absorbing layer 12 may be about 3 um of $Al_{0.06}Ga_{0.94}As$, which produces a cutoff wavelength of about 827 nm. Like above, the Al fraction is used to tune the bandgap of the first absorbing layer 12. When so provided, only wavelengths that are longer than about 827 nm tend to pass through the first absorbing layer 12 and into the remainder of the structure. The first absorbing layer 12 may be doped p-type at a concentration of about 1E18.

The remaining light 22b and 22c may pass into the upper confinement layer 14. The upper confinement layer 14 may be about 0.2 um of $Al_{0.2}Ga_{0.8}As$, which produces a cutoff wavelength of about 735 nm. Thus, the upper confinement layer 14 may be substantially transparent to the light 22b and 22c that passes through the first absorbing layer 12. However, the bandgap of the upper confinement layer 14 may be higher than the bandgap of the first absorbing layer 12, which may help prevent the carriers that are generated in the first absorbing layer 12 from reaching the second absorbing layer 16. The upper confinement layer 14 may be doped p-type at a concentration of about 1E18.

The second absorbing layer 16 receives the light 22b and 22c that passes through the first absorbing layer 12 and the upper confinement layer 14. The second absorbing layer may be about 3.0 um of $Al_{0.0}Ga_{1.0}As$, which produces a cutoff wavelength of about 871 nm. Thus, the second absorbing layer 16 may absorb the remaining light that has a wavelength between 827 and 871 nm, and may pass the light 22c that has a wavelength that is longer than about 871 nm. The second absorbing layer 16 may be doped n-type at a fairly low concentration, such as about <5E14. This fairly low concentration may help the second absorbing layer 16 become more easily depleted under reverse bias operating conditions, which may help increase the speed of the detector 10.

The lower confinement layer 18 receives the light 22c that passes through the second absorbing layer 16. The lower confinement layer 18 may be about 0.1 um of $Al_{0.2}Ga_{0.8}As$, which produces a cutoff wavelength of about 735 nm. Thus, the lower confinement layer 16 may be substantially transparent to the light 22c that passes through the second absorbing layer 16. In the illustrative example, the lower confinement layer 18 may be doped n-type at a concentration of about 3E18.

In some embodiments, a buffer layer may be provided between the lower confinement layer 18 and the substrate 20. The buffer may be, for example, about 0.2 um of $Al_{0.0}Ga_{1.0}As$, which produces a cutoff wavelength of about 871 nm. The buffer layer may be doped n-type at a concentration of about 1E18.

Finally, the substrate 20 may be GaAs, which is doped n-type. Some of the light 22c that passes through the lower confinement layer 18 is absorbed by the substrate 20. To help prevent carrier that are generated in the substrate 20 from reaching the second absorbing layer 16, the bandgap of the lower confinement layer 18 is preferably higher than the bandgap of the substrate 20.

Figure 2:
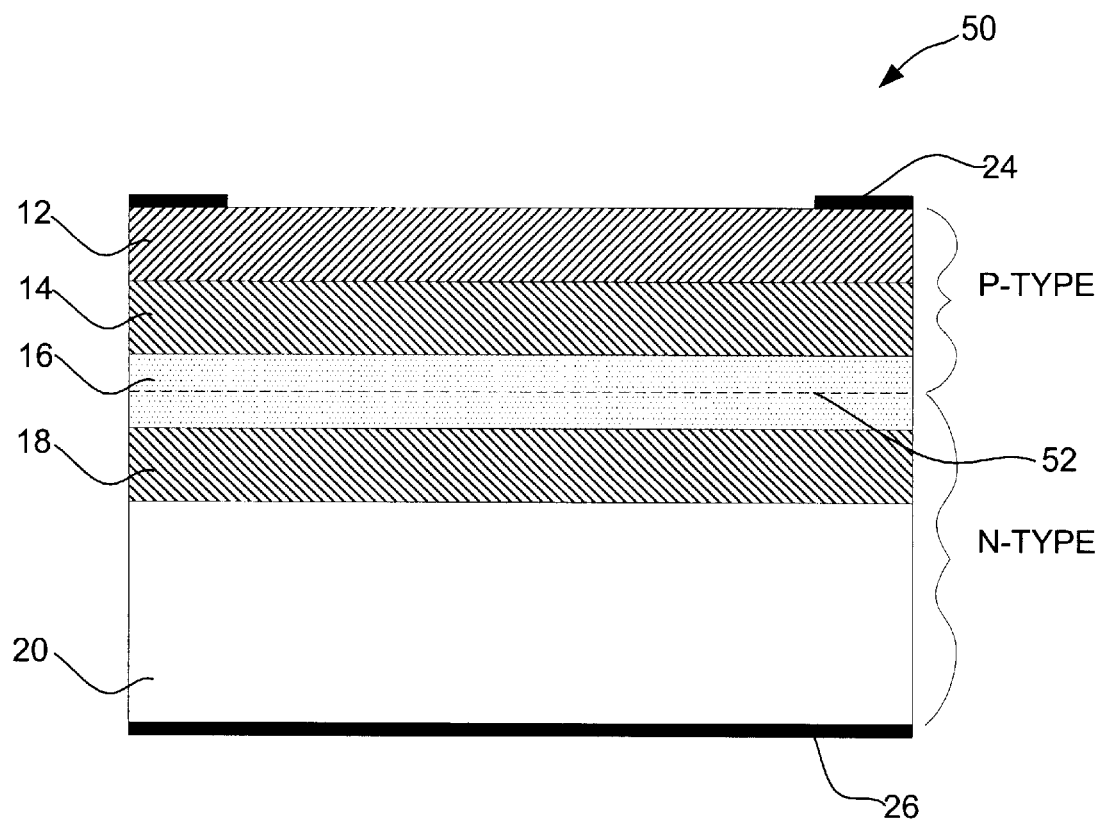
FIG. 2 is a schematic cross-sectional view of another illustrative wavelength selective detector in accordance with the present invention.

FIG. 2 is a schematic cross-sectional view of another illustrative wavelength selective detector 50. The illustrative wavelength selective detector 50 includes a PN junction 52 in the second absorbing layer, rather than between the second absorbing layer and an adjacent confinement layer as shown in FIG. 1. As such, and as shown in FIG. 2, the first absorbing layer 12, the upper confinement layer 14, and an upper part of the second absorbing layer 16 may be doped to be a first conductivity type (e.g. p-type), and a lower part of the second absorbing layer 16, the lower confinement layer 18 and the substrate 20 may be doped to be of the opposite conductivity type (e.g. n-type). The remainder of the structure may be similar to that shown and described above with respect to FIG. 1.

Figure 3:
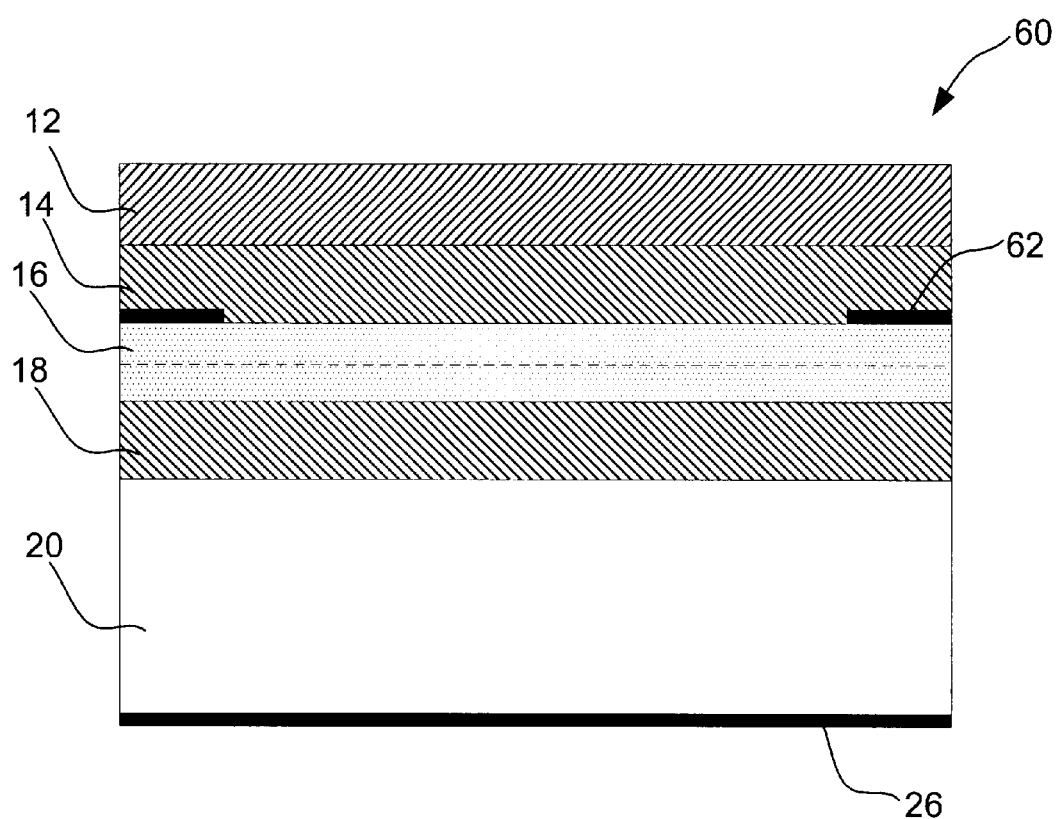
FIG. 3 is a schematic cross-sectional view of yet another illustrative wavelength selective detector in accordance with the present invention.

FIG. 3 is a schematic cross-sectional view of yet another illustrative wavelength selective detector 60 in accordance with the present invention. Like the embodiment shown in FIG. 2, the illustrative wavelength selective detector 60 includes a PN junction 52 that is positioned within the second absorbing layer 16, rather than between the second absorbing layer 16 and an adjacent confinement layer as shown in FIG. 1. However, unlike the embodiments shown in FIGS. 1 and 2, the upper contact layer 62 is positioned between the second absorbing layer 16 and the upper confinement layer 14. In some embodiments, this may reduce the resistance of the detector 60. This may also enable the use of non-conductive (e.g. intrinsic semiconductors, dielectrics, etc.) for one or more of the first absorbing layer 12 and/or upper confinement layer 14, which may be desirable in some applications. In FIG. 3, the upper contact layer 62 is deposited and patterned before the upper confinement layer 14 and first absorbing layer 12 are provided.

Figure 4:
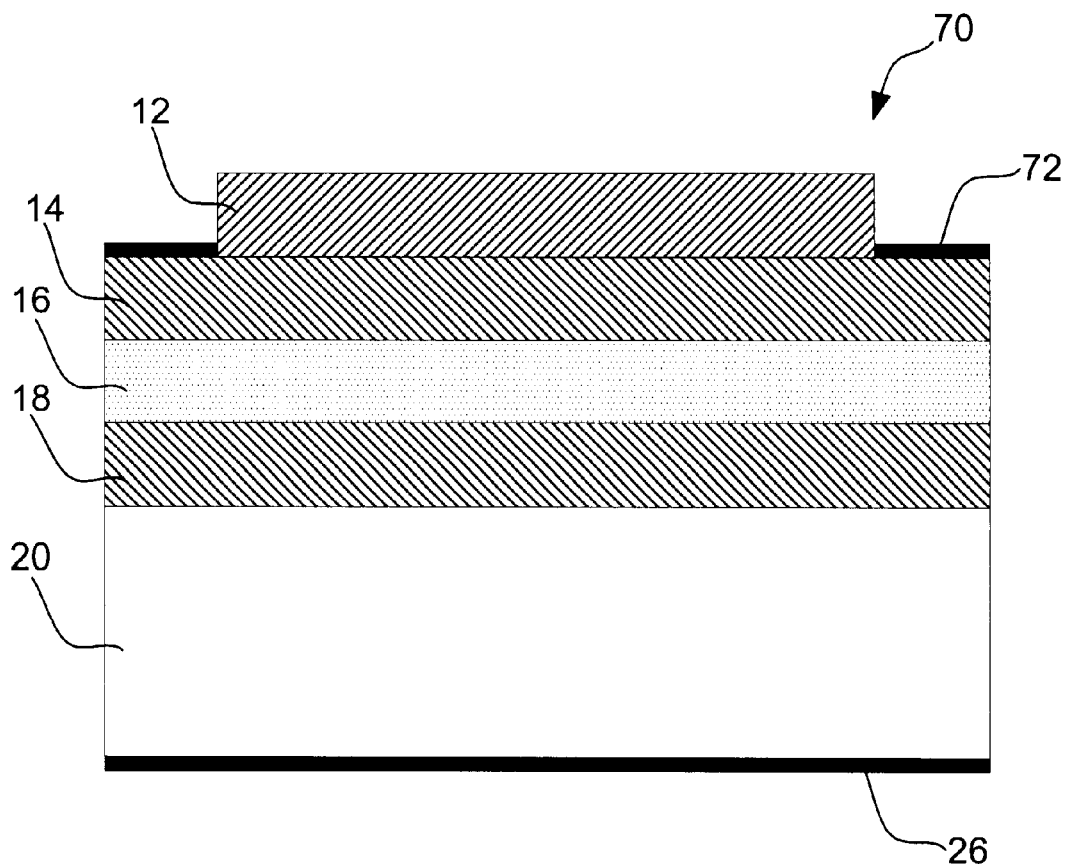
FIG. 4 is a schematic cross-sectional view of another illustrative wavelength selective detector in accordance with the present invention.

FIG. 4 is a schematic cross-sectional view of another illustrative wavelength selective detector 70 in accordance with the present invention. In this illustrative embodiment, the first absorbing layer 12 is etched or otherwise removed from around the periphery of the detector exposing the upper confinement layer 14. An upper contact layer 72 is then provided adjacent the exposed portion of the upper confinement layer 14. In some embodiments, this may reduce the resistance of the detector 70. This may also enable the use of non-conductive (e.g. intrinsic semi-conductors, dielectrics, etc.) for the first absorbing layer 12, if desired.

In a similar manner, it is contemplated that the lower contact layer 26 may be provided between the substrate 20 and the lower confinement layer 18, or between the lower confinement layer 18 and the second absorbing layer 16, if desired. It is also contemplated that additional layers may be provided beyond those shown in FIGS. 1–4, including for example, one or more buffer layers to help provide a transition if there is a mismatch between the crystalline structure of some of the layers.

Figure 5:
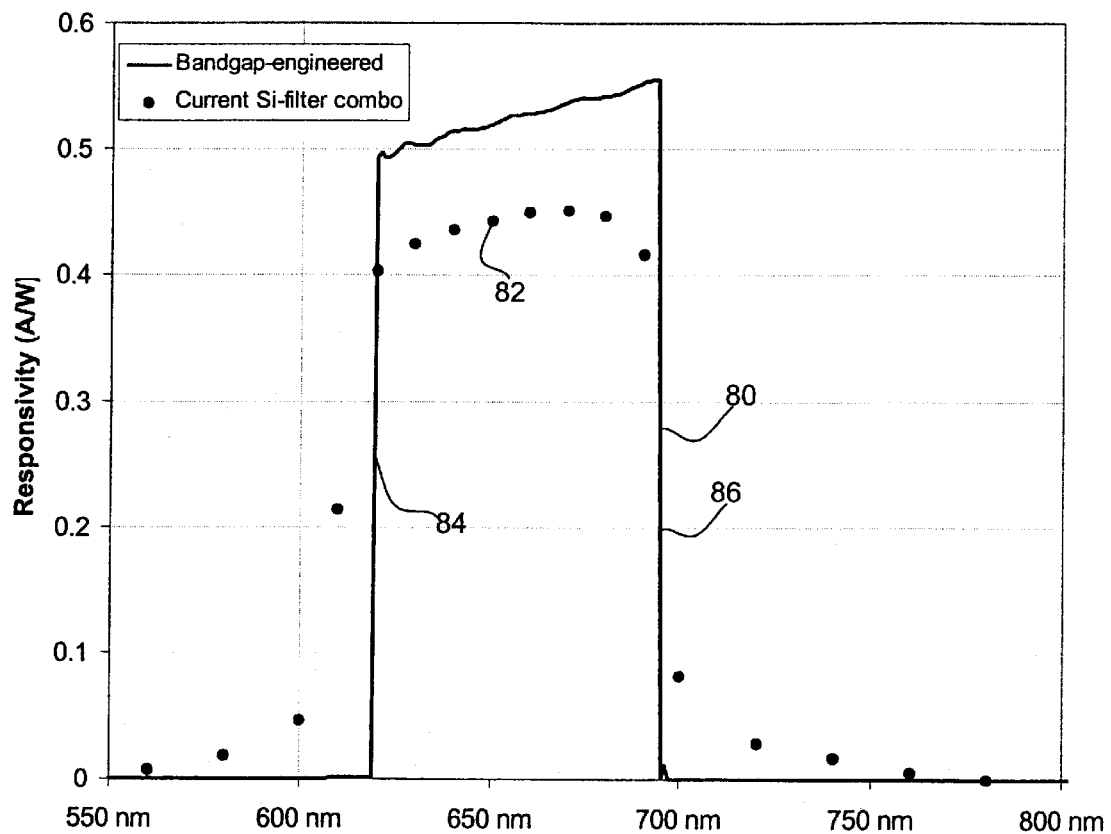
FIG. 5 is a graph showing the simulated responsivity of a wavelength selective detector in accordance with the present invention, as well as the responsivity of a conventional wavelength selective detector that has one or more bandpass filters coupled to a broad-band silicon detector.

FIG. 5 is a graph showing the simulated responsivity of a wavelength selective detector in accordance with the present invention, as well as the responsivity of a conventional wavelength selective detector that has one or more bandpass filters on top of a broad-band silicon detector. The simulated responsivity of the wavelength selective detector of the present invention is shown as a black curve 80, and the responsivity of the conventional broad-band wavelength selective detector with one or more bandpass filters is shown as a series of black dots, including black dot 82.

As can be seen, the simulated responsivity 80 of the wavelength selective detector of the present invention includes a sharp lower band cutoff 84 and a sharp upper band cutoff 86 (both near zero edge response). As indicated above with respect to FIG. 1, the first absorbing layer 12 preferably is used to absorb the light that has a wavelength below the lower band cutoff 84, while passing light that has a wavelength that is above the lower band cutoff 84.

The downstream second absorbing layer 16 then absorbs light that has a wavelength below the upper band cutoff 86, while passing light that has a wavelength above the upper band cutoff 86. The simulated responsivity 80 of the wavelength selective detector of the present invention shows very good out-of-band rejection, narrow spectral responsivity, and high in-band responsivity. The spectral in-band window may be narrower or wider than shown. A narrower spectral in-band window (e.g. less than 50 nm full width) may be desirable in some applications, such as Wavelength Division Multiplexing (WDM) applications.

The lower band cutoff 84 is preferably set by, for example, using a material or material system in the first absorbing layer 12 that has a bandgap that corresponds to the lower band cutoff 84, as well as selecting an appropriate thickness for the first absorbing layer 12. The upper band cutoff 86 is preferably set by, for example, using a material or material system in the second absorbing layer 16 that has a bandgap that corresponds to the upper band cutoff 86, as well as selecting an appropriate thickness for the second absorbing layer 16. Allowing a less rapid extinction at the lower band cutoff 84 and/or the upper band cutoff 86 may reduce the cost of fabricating the detector in some cases.

As can be seen, the simulated responsivity 80 of the illustrative wavelength selective detector has significantly sharper upper and lower band cutoffs than the broadband silicon detector/filter combination. In addition, it is known that many broad-band silicon detector/filter devices have significant changes of edge position and responsivity within a range of intended incident angles. The responsivity of the wavelength selective detector of the present invention may be substantially unaffected within the same angular range. Finally, a detector fabricated as described herein is substantially insensitive to radiation incident on the sides of the detector. This is not the case when a filter is affixed to a detector with broadband response, where the sides may be sensitive to undersirable wavelengths.

Having thus described the preferred embodiments of the present invention, those of skill in the art will readily appreciate that the teachings found herein maybe applied to yet other embodiments within the scope of the claims hereto attached.

What is claimed is:

1. A detector for detecting a desired wavelength or range of wavelengths of light, comprising:
    a first absorbing layer for absorbing light that has a wavelength below the desired wavelength or range of wavelengths;
    a second absorbing layer for absorbing light that has the desired wavelength or range of wavelengths;
    a first confinement layer situated between the first absorbing layer and the second absorbing layer for substantially preventing any carriers that are generated in the first absorbing layer from entering the second absorbing layer.

2. A detector according to claim 1 wherein the first confinement layer is substantially transparent to light having the desired wavelength or range of wavelengths.

3. A detector according to claim 1 wherein the second absorbing layer is substantially transparent to light that has a wavelength that is greater than the desired wavelength or range of wavelengths.

4. A detector according to claim 1 wherein the first absorbing layer, the second absorbing layer and the first confinement layer each are formed from a material or material system that has a bandgap energy, the band gap energy of the first confinement layer is larger than the bandgap energy of both the first absorbing layer and the second absorbing layer.

5. A detector according to claim 4 wherein the bandgap energy of the first absorbing layer is larger than the bandgap energy of the second absorbing layer.

6. A detector according to claim 1, wherein the detector receives light on an incident side, and said first absorbing layer is positioned closer to the incident side of the detector than the second absorbing layer.

7. A detector according to claim 1 further comprising:
    a second confinement layer;
    wherein the second absorbing layer is positioned between the first confinement layer and the second confinement layer.

8. A detector according to claim 1, wherein the second absorbing layer includes a PN junction, and wherein an output of the detector is taken across the PN junction.

9. A detector according to claim 1, wherein the second absorbing layer and an adjacent layer form a PN junction, and wherein an output of the detector is taken across the PN junction.

10. A detector for detecting a desired range of wavelengths of light, the light entering the detector from an incident side, the detector comprising:
    a first absorbing layer positioned adjacent the incident side of the detector, the first absorbing layer having at least one layer with a bandgap energy that is adapted for absorbing light having a wavelength that is below the desired range of wavelengths;

a second absorbing layer positioned downstream of the first absorbing layer, the second absorbing layer having at least one layer with a bandgap energy that is adapted for absorbing light that has the desired range of wavelengths as well as light that has a wavelength that is below the desired range of wavelengths; and a first confinement layer situated between the first absorbing layer and the second absorbing layer for substantially preventing any carriers that are generated in the first absorbing layer from entering the second absorbing layer.

11. A detector according to claim 10 wherein the at least one layer of the first absorbing layer has a bandgap energy that is larger than the bandgap energy of the at least one layer of the second absorbing layer.

12. A detector according to claim 11 wherein the first confinement layer has at least one layer with a bandgap energy, the bandgap energy of the at least one layer of the confinement layer is larger than the bandgap energy of the at least one layer of the first absorbing layer and the at least one layer of the second absorbing layer.

13. A detector for detecting a desired range of wavelengths of light wherein the light enters the detector from an incident side, the desired range of wavelengths defined by a lower cutoff and an upper cutoff, the detector comprising:

a first absorbing layer positioned adjacent the incident side of the detector, the first absorbing layer adapted to absorb light that has a wavelength defined by the lower cutoff of the detector on down for a predetermined absorption spectrum;

a second absorbing layer positioned downstream of the first absorbing layer, the second absorbing layer adapted to absorb light that has a wavelength defined by the upper cutoff of the detector on down for a predetermined absorption spectrum; and a confinement layer situated between the first absorbing layer and the second absorbing layer.

14. A detector according to claim 13 wherein the second absorbing layer includes a PN junction, and wherein an output of the detector is taken across the PN junction.

15. A detector according to claim 13, wherein the second absorbing layer and an adjacent layer form a PN junction, and wherein an output of the detector is taken across the PN junction.

16. A detector for detecting a desired range of wavelengths of light, comprising:

a first absorbing layer for absorbing light that has a wavelength that is below the desired range of wavelengths;

a second absorbing layer for absorbing light that has the desired range of wavelengths;

a substrate;

a first confinement layer situated between the first absorbing layer and the second absorbing layer; and a second confinement layer situated between the second absorbing layer and the substrate.

17. A detector according to claim 16 wherein one or more carriers are generated in the first absorbing layer when the first absorbing layer absorbs light, and wherein one or more carriers are generated in the substrate when the substrate absorbs light, the first confinement layer helping to prevent carriers generated in the first absorbing layer from entering the second absorbing layer, and the second confinement layer helping to prevent carriers generated in the substrate from entering the second absorbing layer.

18. A detector according to claim 16 wherein one or more carriers are generated in the second absorbing layer when the second absorbing layer absorbs light, the first confinement layer and the second confinement layer helping to keep the carriers that are generated in the second absorbing layer from escaping into the first absorbing layer or substrate.

19. A detector according to claim 18 wherein the first confinement layer, the second confinement layer and the second absorbing layer are each formed from a material or material system that has a bandgap energy.

20. A detector according to claim 19 wherein the bandgap energy of the second absorbing layer is less than the bandgap energy of the first confinement layer and the second confinement layer.

21. A detector according to claim 20 wherein the first absorbing layer is formed from a material or material system that has a bandgap energy, and wherein the bandgap energy of the first absorbing layer is larger than the bandgap energy of the second absorbing layer, but less than the bandgap energy of the first confinement layer and the second confinement layer.

* * * * *